United States Patent
Zhang

(10) Patent No.: US 8,072,775 B2
(45) Date of Patent: Dec. 6, 2011

(54) PRINTED CIRCUIT BOARD

(75) Inventor: Xiang Zhang, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

(*) Notice: Subject to any disclaimer, the term of this patent is extended or adjusted under 35 U.S.C. 154(b) by 726 days.

(21) Appl. No.: 12/180,233

(22) Filed: Jul. 25, 2008

(65) Prior Publication Data

US 2009/0255718 A1    Oct. 15, 2009

(30) Foreign Application Priority Data

Apr. 11, 2008   (CN) .......................... 2008 2 0300534

(51) Int. Cl.
*H05K 1/16*     (2006.01)
*H05K 1/18*     (2006.01)

(52) U.S. Cl. ........ 361/794; 361/760; 361/763; 174/255; 174/260

(58) Field of Classification Search .................. 361/732, 361/736, 750, 751, 760–767, 748, 780–783, 361/777, 790–794, 816, 818; 174/150–258, 174/260–266; 257/678, 686, 723–725, 750, 257/758, 762, 773, 777, 778; 29/830–832, 29/825, 846, 852
See application file for complete search history.

(56) References Cited

U.S. PATENT DOCUMENTS

| | | | | |
|---|---|---|---|---|
| 5,488,540 A * | 1/1996 | Hatta | | 361/794 |
| 5,587,887 A * | 12/1996 | Price et al. | | 361/794 |
| 5,736,796 A * | 4/1998 | Price et al. | | 307/151 |
| 5,761,051 A * | 6/1998 | Tran | | 361/794 |
| 5,764,491 A * | 6/1998 | Tran | | 361/794 |
| 5,926,377 A * | 7/1999 | Nakao et al. | | 361/763 |
| 5,966,294 A * | 10/1999 | Harada et al. | | 361/794 |
| 6,084,779 A * | 7/2000 | Fang | | 361/763 |
| 6,178,311 B1 * | 1/2001 | Pance et al. | | 455/78 |
| 6,418,032 B2 * | 7/2002 | Hirata et al. | | 361/780 |
| 6,473,312 B1 * | 10/2002 | Hiratsuka et al. | | 361/794 |
| 6,798,666 B1 * | 9/2004 | Alexander et al. | | 361/766 |
| 6,909,052 B1 * | 6/2005 | Haug et al. | | 174/255 |
| 7,068,518 B2 * | 6/2006 | Ueno et al. | | 361/760 |
| 7,129,419 B2 * | 10/2006 | Chao et al. | | 174/260 |
| 7,176,383 B2 * | 2/2007 | Lauffer et al. | | 174/255 |
| 7,183,492 B2 * | 2/2007 | Chao et al. | | 174/255 |
| 7,230,835 B1 * | 6/2007 | Ahmad | | 361/794 |
| 7,259,334 B2 * | 8/2007 | Chao et al. | | 174/255 |
| 7,501,583 B2 * | 3/2009 | Chao et al. | | 174/255 |
| 7,530,167 B2 * | 5/2009 | Lauffer et al. | | 29/852 |
| 7,655,870 B2 * | 2/2010 | Chang et al. | | 174/255 |
| 7,778,039 B2 * | 8/2010 | Chen et al. | | 361/763 |
| 2007/0291459 A1 * | 12/2007 | Hsu et al. | | 361/794 |

* cited by examiner

*Primary Examiner* — Michail V Datskovskiy
(74) *Attorney, Agent, or Firm* — Altis Law Group, Inc.

(57) ABSTRACT

A printed circuit board includes a signal layer and a voltage source layer. The signal layer includes a connecting area. The voltage source layer includes an isolation area corresponding to the connecting area. The isolation area is used for preventing interference caused by a pulsing current in the connecting area from affecting the voltage source layer.

7 Claims, 3 Drawing Sheets

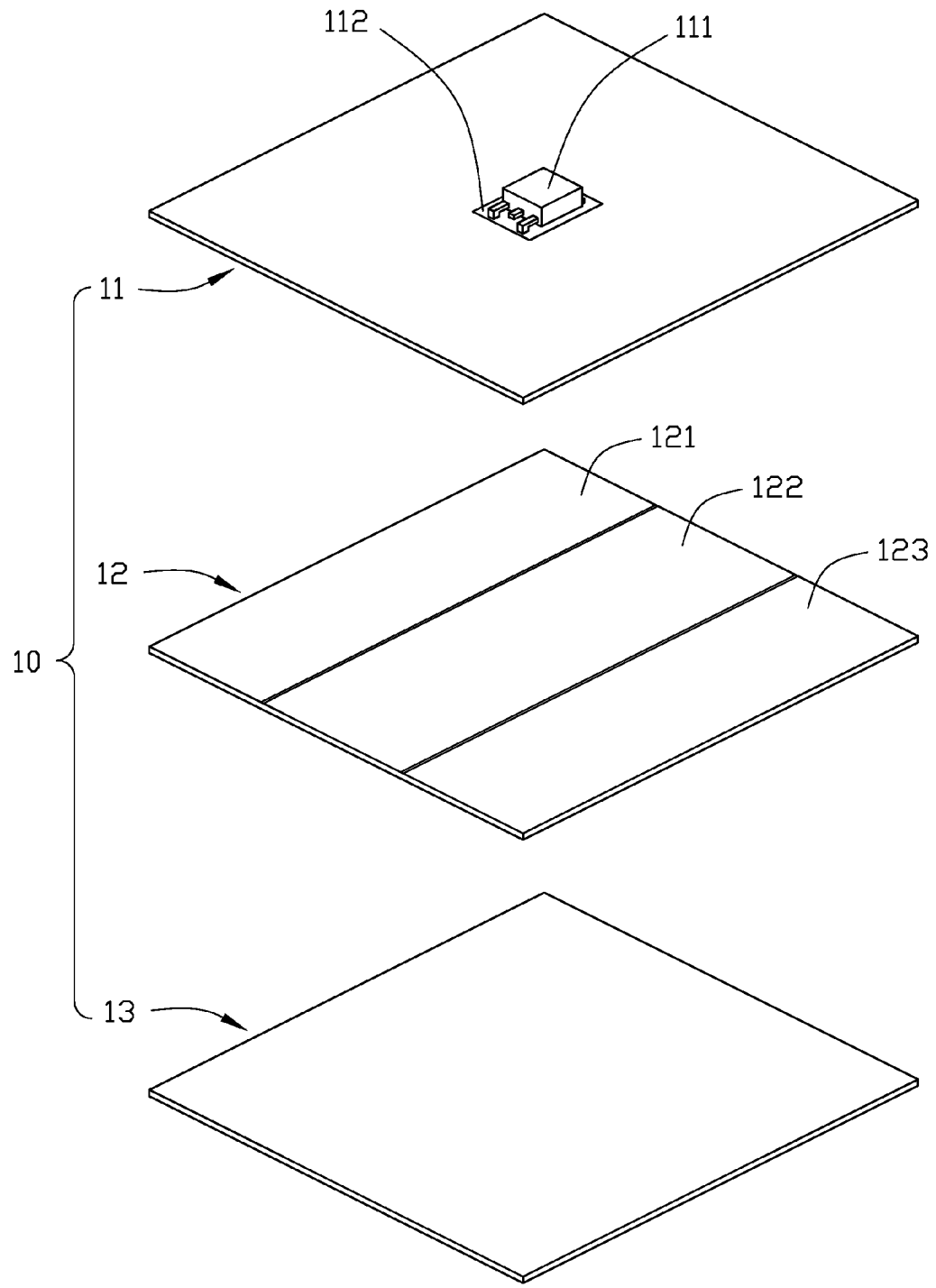
FIG. 3 <PRIOR ART>

PRINTED CIRCUIT BOARD

BACKGROUND

1. Technical Field

The present invention relates to a printed circuit board having an isolation area for reducing signal interference between two layers.

2. Description of Related Art

A typical printed circuit board (hereinafter referred to as PCB) 10 includes a signal layer 11, a voltage source layer 12, and a ground layer 13, as shown in FIG. 3. The signal layer 11 is used as a layout for signal lines. A connecting area 112 is provided on the signal layer 11. A switch element 111 is positioned in the connecting area 112. The voltage source layer 12 is divided into a plurality of voltage areas 121, 122, 123 according to different voltage values. The connecting area 112 is positioned entirely in the voltage area 122.

The switch element 111 turns on and off periodically when receiving pulse signals, enabling current flowing through the connecting area 112 to be a pulsing current. However, the voltage in the area 122 of the voltage source layer 12 becomes unstable because of an interference caused by the pulsing current flow in the connecting area 112.

Therefore, a PCB having an isolation area for reducing signal interference is desired to overcome the above described deficiency.

BRIEF DESCRIPTION OF THE DRAWINGS

FIG. 3 is an exploded, isometric view of a typical PCB.

DETAILED DESCRIPTION OF THE EMBODIMENTS

Figure 1:
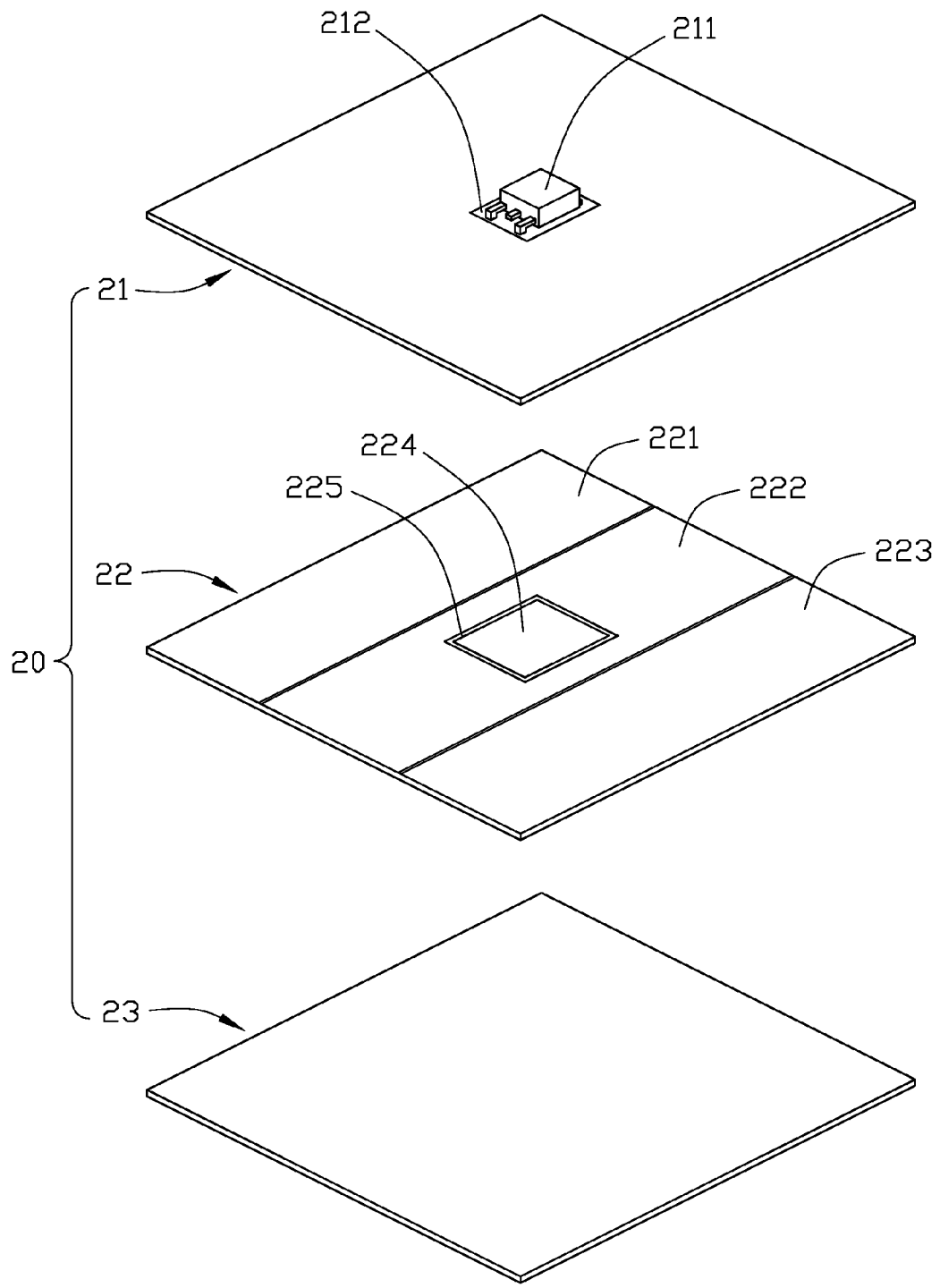
FIG. 1 is an exploded, isometric view of an embodiment of a PCB.

Referring to FIG. 1, a PCB 20 includes a signal layer 21, a ground layer 23, and a voltage source layer 22 positioned between the signal layer 21 and the ground layer 23.

The signal layer 21 is used as a layout for signal lines. A connecting area 212 is provided on the signal layer 21. A switch element 211 is positioned in the connecting area 212 of the signal layer 21. The switch element 211 is an electronic component, such as a metal-oxide-semiconductor (MOS) transistor, capable of receiving pulse signals. The voltage source layer 22 is divided into a plurality of voltage areas 221, 222, 223 by isolation lines according to different voltage values.

Figure 2:
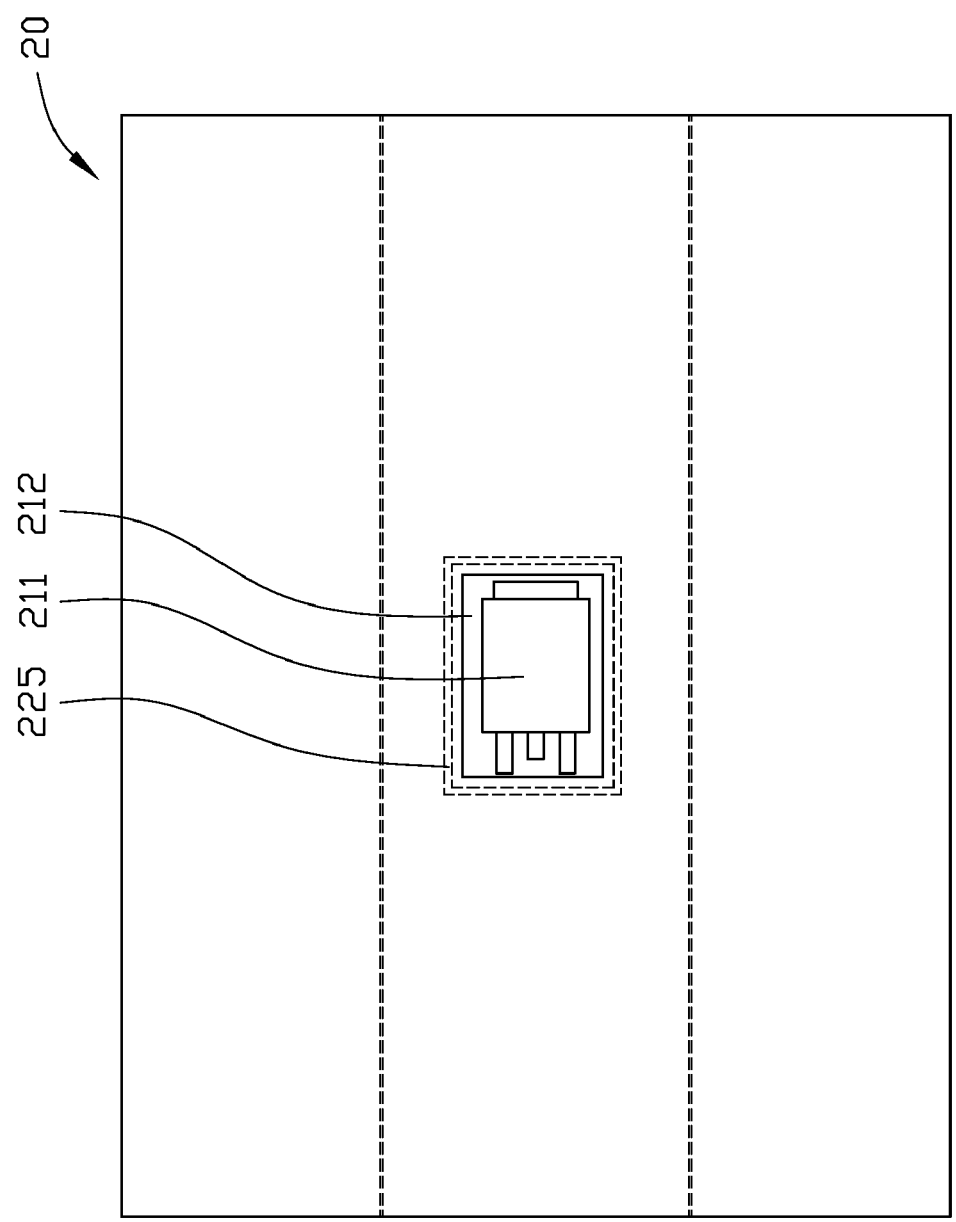
FIG. 2 is a plan view of the PCB of FIG. 2.

Referring also to FIG. 2, an isolation area 224 corresponding to the connecting area 212 is provided on the voltage area 222. The connecting area 212 is positioned entirely in the isolation area 224. An isolation line 225 is provided along a periphery of the isolation area 224 such that there is no electrical connection between the isolation area 224 and the area 222. In another embodiment, an isolation area 224 can be provided on the ground layer 23 corresponding to the connecting area 212.

The connecting area 212 is positioned in the isolation area 224. The switch element 211 is configured to turn on and off periodically when receiving pulse signals, enabling current flowing through the connecting area 212 to be a pulse current. Interference generated on the signal layer 21 from the connecting area 212 due to the pulse current cannot affect the voltage area 222 because there is no electrical connection between the isolation area 224 and the voltage area 222, thereby reducing interference to the PCB 20.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A printed circuit board, comprising:
   a signal layer comprising a connecting area; and
   a voltage source layer comprising a first isolation area corresponding to the connecting area, the first isolation area configured for preventing interference caused by a pulsing current in the connecting area from affecting the voltage source layer;
   wherein the voltage source layer further comprises a first isolation line separating the first isolation area from a rest area of the voltage source layer, and there is no electrical connection between the first isolation area and the rest area of the voltage source layer; the voltage source layer is divided into a plurality of voltage areas by a plurality of second isolation lines according to different voltages for the signal layer, the first isolation area is defined in one of the plurality of voltage areas.

2. The printed circuit board of claim 1, wherein the connecting area is positioned to be confined within the first isolation area.

3. The printed circuit board of claim 1, further comprising an electronic component capable of receiving pulse signals, the electronic component is positioned in the connecting area of the signal layer.

4. The printed circuit board of claim 3, wherein the electronic component is a switch element.

5. A printed circuit board, comprising:
   a signal layer comprising a connecting area and an electronic component positioned in the connecting area, the electronic component capable of receiving pulse signals; and
   a voltage source layer comprising a first isolation area corresponding to the connecting area;
   wherein the connecting area is positioned to be confined within the first isolation area;
   the voltage source layer is divided into a plurality of voltage areas by a plurality of first isolation lines according to different voltages for the signal layer; the first isolation area is defined in one of the plurality of voltage areas.

6. The printed circuit board of claim 5, wherein the voltage source layer further comprises a second isolation line separating the first isolation area from a rest area of the voltage source, there is no electrical connection between the first isolation area and the rest area of the voltage source layer.

7. The printed circuit board of claim 5, wherein the electronic component is a switch element.

* * * * *